INVENTOR.
James R Black
Robert Mattox
BY
Mueller, Aichele, & Rauner
Att'ys

FIG 2d1

INVENTOR.
James R Black
Robert Mattox
BY
Mueller, Aichele, & Rauner
Atty's

INVENTOR.
James R Black
Robert Mattox
BY
Mueller, Aichele, & Rauner
Att'ys

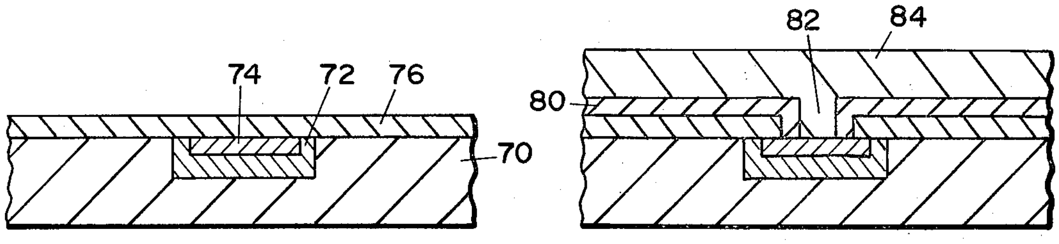
FIG 4a, FIG 4e
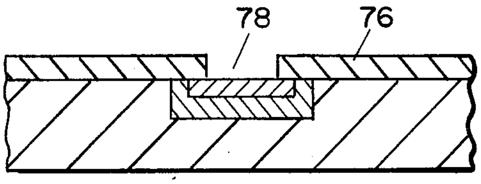
FIG 4b
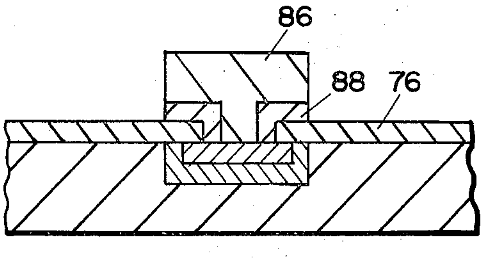
FIG 4f
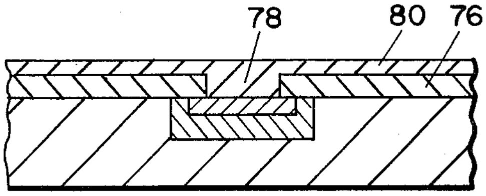
FIG 4c
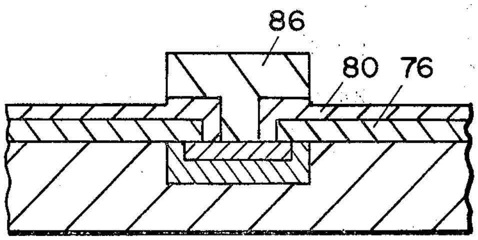
FIG 4f₁
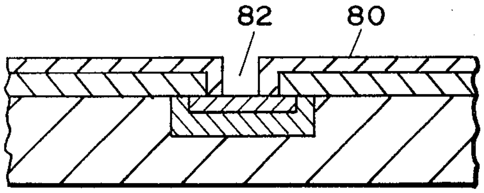
FIG 4d
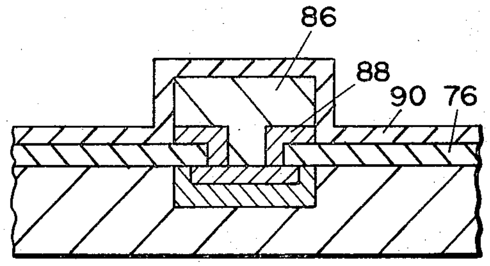
FIG 4g
INVENTOR.
James R Black
Robert Mattox
BY
Mueller, Aichele, & Rauner
Attys 3,825,453

METHOD OF PREVENTING A CHEMICAL REACTION BETWEEN ALUMINUM AND SILICON DIOXIDE IN A SEMICONDUCTOR DEVICE

James R. Black and Robert J. Mattox, Phoenix, Ariz., assignors to Motorola, Inc., Franklin Park, Ill.

Continuation of abandoned application Ser. No. 860,983, Sept. 25, 1969. This application Dec. 20, 1971, Ser. No. 210,132
Int. Cl. C23c 11/08, 13/02
U.S. Cl. 156—3 5 Claims

ABSTRACT OF THE DISCLOSURE

A method of preventing a chemical reaction in a semiconductor device between an aluminum film and a silicon dioxide substrate in contact therewith is disclosed. The method involves interposing a film of aluminum oxide between the aluminum film and the silicon dioxide substrate. A second step provides a layer of aluminum oxide on the silicon dioxide substrate adjacent the aluminum film.

This is a continuation of Ser. No. 860,983, filed Sept. 25, 1969 now abandoned.

BACKGROUND OF THE INVENTION

This invention relates to semiconductor devices and more particularly to preventing a chemical reaction in a semiconductor device between a layer of aluminum and a layer of silicon dioxide.

Aluminum is widely used as a contact metal in semiconductors and as an interconnecting metal in integrated circuit structures. Silicon dioxide is also widely used as an insulative layer and as a mask in semiconductor devices. As a result, aluminum films are frequently in contact with silicon dioxide in these devices. When the aluminum film is in contact with silicon dioxide at elevated temperatures, the aluminum reacts with the silicon dioxide in accordance with the following reaction to form alumina and silicon.

$$4Al + 3SiO_2 \xrightarrow[\Delta]{} 2Al_2O_3 + 3Si$$

In many devices this reaction results in the aluminum electrically shorting through a thin insulating layer of the silicon dioxide thereby causing a failure of the device. This reaction and the resultant shorting is a severe problem particularly at the edges of the aluminum films that are in contact with the silicon dioxide surface.

SUMMARY OF THE INVENTION

It is an object of this invention to prevent the chemical reaction between an aluminum film and a silicon dioxide substrate. It is another object of this invention to eliminate electrical shorting in semiconductor devices resuling from aluminum reacting with silicon dioxide.

These and other objects are accomplished by a method of preventing the chemical reaction between an aluminum film and a silicon dioxide substrate. The method involves the step of interposing a film of aluminum oxide between the aluminum film and the silicon dioxide and by providing a layer of aluminum oxide on the silicon dioxide substrate adjacent the edge of the aluminum film. The aluminum oxide layers prevent the aluminum film from reacting with the silicon dioxide substrate.

Other objects and advantages of this invention are clearly shown in the following detailed description, reference being made to the accompanying drawings wherein preferred embodiments of this invention are shown.

IN THE DRAWINGS

FIG. 4 shows a device similar to that shown in FIG. 3 involving an alternate process of the present invention.

DESCRIPTION OF THE ILLUSTRATIVE EMBODIMENT

Figure 1A:
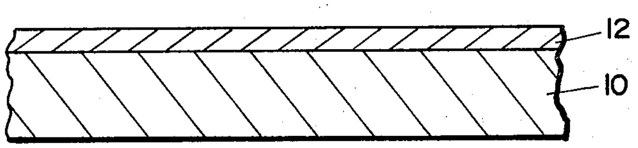
FIG. 1 is a detailed sectional view of an integrated circuit structure in which an aluminum film serves as an interconnect between multi-layer circuits made in accordance with a process of the present invention.
Figure 1B:
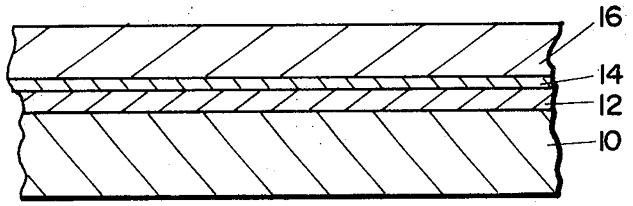

Like numerals are used to identify similar parts of the invention as shown in the several views.

As shown in FIG. 1, an integrated circuit structure consisting of a silicon substrate 10 having a major surface 11 and having a silicon dioxide layer 12 formed thereon is placed in a vacuum furnace and a layer of aluminum is vacuumed deposited thereon with an upper surface 13. The vacuum conditions are controlled so that the temperature that the temperature that the aluminum is deposited is at or below 300° C. and the pressure is $10^{-5}$ torr or higher. At these relatively low temperatures and relatively high pressures, the aluminum will react with water vapor that is present in the system to form a first layer 14 of alumina $Al_2O_3$, on top of the silicon dioxide layer 12 and underneath the aluminum layer 16 as shown in FIG 1*b*. The temperature should not exceed 300° C. since at temperatures above 300° C. it is difficult to form aluminum oxide in this type of system. The relative high pressures of $10^{-5}$ torr and higher involved in the vacuum deposition are also essential in order for the aluminum to react with water vapor to form the aluminum oxide. At temperatures higher than 300° C. and at pressures lower than $10^{-5}$ torr, water vapor is not present in sufficient amounts to form aluminum oxide layer 14 and would result in the aluminum layer 16 being deposited directly on the silicon dioxide layer 12. In accordance with this invention, the formation of the aluminum oxide layer 14 is necessary in accordance with this embodiment of this invention.

Figure 1C:
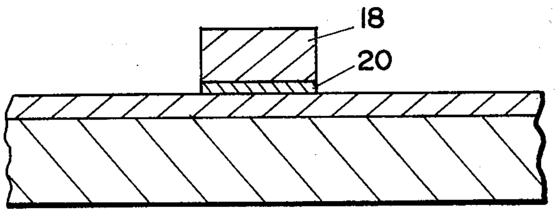
Figure 1D:
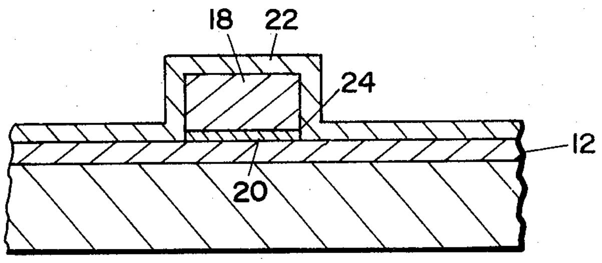

The aluminum layer 16 and the aluminum oxide layer 14 are masked and etched by conventional means to form the desired aluminum pattern 18, the aluminum oxide layer 20 having a pattern similar to that of the aluminum 18 as shown in FIG. 1*c*. The patterned aluminum oxide layer 20 is formed having an exposed edge portion 21. The formation of the pattern of aluminum 18 and the aluminum oxide 20 exposes a portion of the upper surface 13 of the silicon dioxide layer 12. In FIG. 1*d* a second layer 22 of aluminum oxide is then vapor plated on top of the aluminum strip 18 and the silicon dioxide layer 12. It is important that the layer 22 cover the silicon dioxide substrate 12 which is adjacent to the aluminum film edge 24. It has been observed that the aluminum film 18 has a tendency to react with the silicon dioxide layer 12 at the edge 24. The edge portion 21 of the aluminum oxide layer 20 and the aluminum oxide layer 22 combine to prevent the aluminum film 18 from reacting with the silicon dioxide layer 12.

While the aluminum oxide layer 14 in FIG. 1 underneath the aluminum film 16 was formed during the vacuum deposition of the aluminum film, an alternate procedure is shown in FIG. 2 for preventing the reaction between the aluminum and the silicon dioxide layer. In FIG. 2*a* the silicon dioxide layer 30 is formed by conventional means on the major surface 11 top of the silicon substrate 32. A first layer of aluminum oxide 34 is then vapor deposited on the upper surface 13 of the silicon dioxide layer 30 as shown in FIG. 2*b*. A film of aluminum 36 is deposited on top of the aluminum oxide layer 34, as in FIG. 2*c*. The aluminum film 36 and the aluminum oxide layer 34 are etched to provide the desired aluminum pattern as shown in FIG. 2*d*. A second layer of aluminum dioxide 42 is deposited on the aluminum pattern 38 as shown in FIG. 2*e*.

Figure 2A:
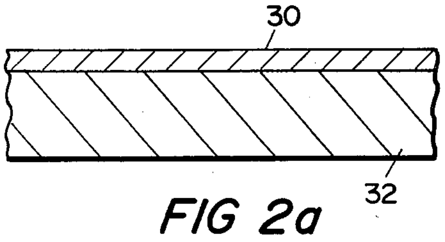
FIG. 2 shows a similar structure involving an alternate process of the present invention.
Figure 2D:
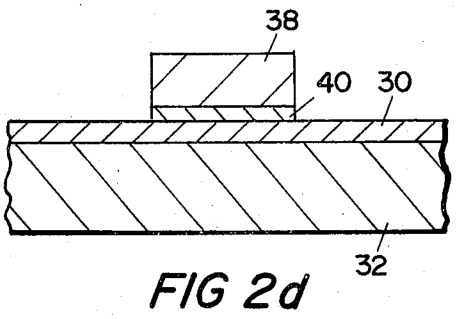
Figure 2B:
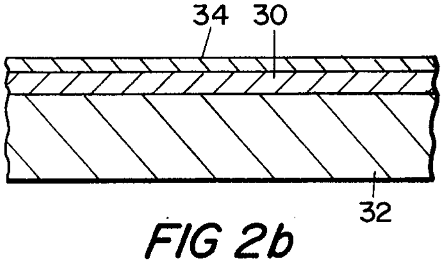
Figure 2C:
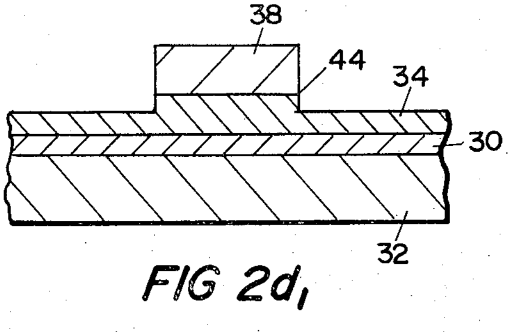
Figure 2C:
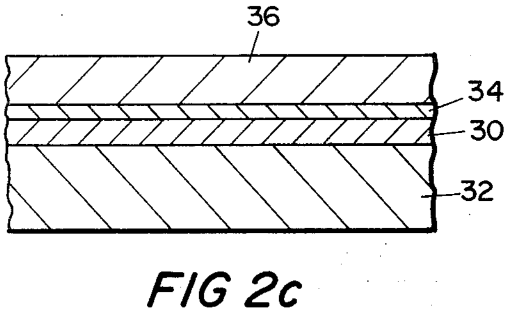
Figure 2E:
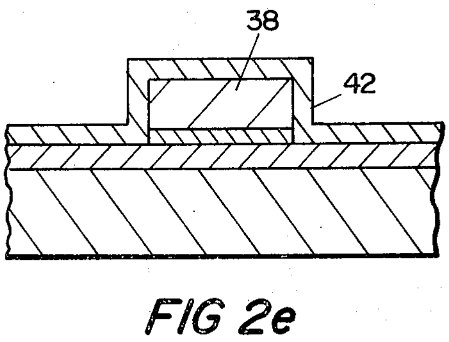

An alternative embodiment of this procedure is shown in FIG. 2*d*, in which the etching step etches only partially through the aluminum oxide layer and does not etch the aluminum oxide layer 34 completely down to the upper surface 13 of the silicon dioxide layer 30 but leaves a portion thereof having a first surface 43 which is sufficient to prevent the reaction at the edges 44 of the aluminum 38.

Figure 3A:
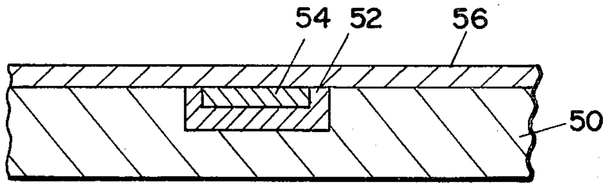
FIG. 3 shows a detailed sectional view of a planar semiconductor device made in accordance with the present invention.
Figure 3B:
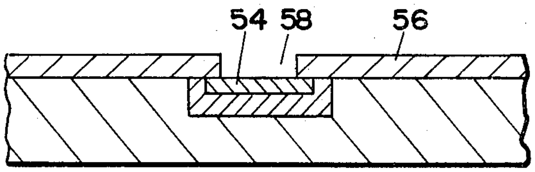
Figure 3C:
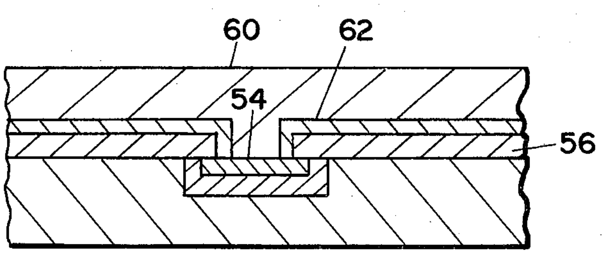
Figure 3D:
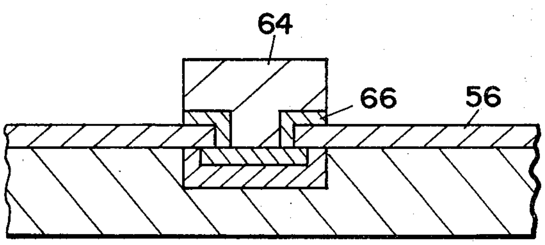
Figure 3E:
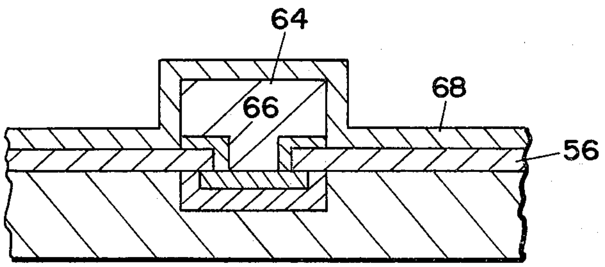

The process of this invention is also applicable to semiconductor devices in which the aluminum film is in contact with the silicon substrate, and any one of many identifiable regions formed therein, for example the emitter, base or collector. In FIG. 3 a silicon substrate 50 has a base region 52 and an emitter region 54. Either region is an identifiable region on a semiconductor substrate and it is required to make contact to either of such regions or to similar region in semiconductor substrates in general. A silicon dioxide layer 56 having the upper surface 13 covers the surface 11 of the major substrate 50 including the base 52 and emitter 54. In accordance with the established practice, a hole is etched in the silicon dioxide layer to provide an opening 58 above the emitter 54 as shown in FIG. 3*b*. This etching step exposes a portion 55 of the identifiable region only to which contact is desired, for example the emitter region 54. Only a portion of the emitter region should be exposed for preventing shorting of the junction separating that region from another region or preventing shorting of the junction separating that region from the substrate body itself. Additionally, the etching operation forms a closed surface member 57 in the silicon dioxide layer 56. This member 57 defines the well known aperture for exposing a portion of the identifiable region only. In accordance with one of the embodiments of this invention as shown in FIG. 3*c* a film of aluminum 60 is vacuum deposited on the silicon dioxide layer 56, under a relatively high pressure and a relatively low temperature to form a first aluminum oxide layer 62 interposed therebetween. Once the layer of aluminum oxide is formed it is patterned in the same manner as shown in FIG. 4*d* prior to forming an aluminum layer 60 thereupon so that the aluminum layer 60 directly contacts the emitter 54. The aluminum layer 60 makes contact directly to the emitter 54 of the silicon substrate. The aluminum layer 60 and the aluminum oxide layer 62 are etched as shown in FIG. 3*d* to provide the aluminum pattern 64 which is separated from the silicon dioxide layer 56 by the aluminum oxide layer portion 66 having the edge portion 21. A second layer of aluminum oxide 68 is then vapor plated on top of the silicon dioxide layer 56 and the aluminum pattern 64 as shown in FIG. 3*e*. The edge portion 21 of the first aluminum oxide layer 66 and the second aluminum oxide layer 68 combine to prevent the aluminum pattern 64 from reacting with the silicon dioxide layer 56.

Another embodiment of this process is shown in FIG. 4 in which the silicon substrate 70 which has identifiable areas formed therein such as a base portion 72 and an emitter portion 74 is coated with a layer of silicon dioxide 76 having an upper surface 11 as shown in (FIG. 4*a*). In FIG. 4*b* the silicon dioxide layer 76 is etched to provide a hole or opening 78 in the silicon dioxide layer. This etching operation forms the closed surface member 57 and exposes a portion 55 of the identifiable region 74. A first layer of aluminum oxide 80 is vapor deposited on top of the silicon dioxide layer 76 and in the opening 78 exposing a smaller part 77 of the portion 55 (FIG. 4*c*). An opening 82 is then etched in the aluminum oxide layer 80 within the former hole 78 as shown in FIG. 4*d*. The aluminum oxide layer 80 contains a wall member 79 which is integrally attached to the closed surface member 57 and to the subportion 55*a* of the portion 55. Aluminum is then deposited under a relatively high vacuum and at relatively high temperatures to form an aluminum layer 84 which covers the aluminum oxide layer 80 and which fills the opening 82 shown in FIG. 4*e* and makes contact with the region 74. The structure of FIG. 4*e* may be treated in either of two ways. In one way shown in FIG. 4*f*, the aluminum layer 84 and the aluminum oxide layer 80 is etched by conventional techniques to provide the aluminum pattern 86 separated from the silicon dioxide layer 76 by the aluminum oxide portion 88 having the edge portion 21. The structure of FIG. 4*f* is coated with a second aluminum oxide layer 90 to provide the structure shown in FIG. 4*g* in which the edge portions of the first aluminum oxide layer portion 88 and the second aluminum oxide layer 90 combine to prevent the aluminum 86 from reacting with the silicon dioxide layer 76.

The structure in FIG. 4*e* may be etched to a lesser degree to obtain the structure shown in FIG. 4*f*, in which the aluminum oxide layer 80 is partially etched away so that a sufficient amount of layer 80 remains having a first surface 43 to prevent the aluminum 86 from reacting with the silicon dioxide layer 76.

All of the embodiments of this invention form a layer of aluminum oxide which separates the aluminum film or pattern from the silicon dioxide layer. These processes specifically form aluminum oxide underneath and adjacent to the outer edges of aluminum film or pattern, to prevent a reaction from occurring between the aluminum film and the silicon dioxide layer.

What is claimed is:

1. A method of preventing a chemical reaction between an aluminum film and a silicon oxide substrate comprising the steps of:

providing a silicon oxide substrate having an upper surface;

forming through vacuum evaporation an aluminum film on said silicon oxide substrate at a temperature below 300° C. and at a pressure greater than about $10^{-5}$ torr in the presence of water vapor, which includes the initial formation of a first film of aluminum oxide on said upper surface of said silicon oxide substrate for separating said aluminum film from said silicon oxide substrate; and forming by chemical vapor deposition a second layer of aluminum oxide on said upper surface of said silicon oxide substrate and integral with said aluminum film whereby, said first aluminum oxide film and said second aluminum oxide layer combine to completely enclose said aluminum film to prevent a reaction between said aluminum film and said substrate.

2. A method of preventing a chemical reaction between an aluminum film and a silicon oxide substarte comprising the steps of:

providing a silicon oxide substrate having an upper surface;

forming through vacuum evaporation an aluminum film on said upper surface of said silicon oxide substrate at a temperature below 300° C. and at a pressure greater than about $10^{-5}$ torr in the presence of water vapor, which includes the initial formation of a first film of aluminum oxide on said upper surface of said silicon oxide substrate for separating said aluminum film from said substrate;

etching said aluminum film and said aluminum oxide film to form a specific pattern of aluminum oxide and aluminum and exposing a portion of said upper surface of said silicon oxide substrate and exposing an edge portion of said first aluminum oxide film; and forming by chemical vapor deposition a second layer of aluminum oxide on said pattern and on said exposed upper surface and said exposed edge portion whereby, said edge portion of said first aluminum oxide film and said second aluminum oxide layer combine to completely enclose said aluminum in said pattern to prevent a reaction between said aluminum film and said substrate.

3. A method of preventing a chemical reaction between an aluminum film and a silicon oxide substrate comprising the steps of:

providing a silicon oxide substrate having an upper surface;

forming through vacuum evaporation an aluminum film on said upper surface of said silicon oxide substrate at a temperature below 300° C. and at a pressure greater than about $10^{-5}$ torr in the presence of water vapor, which includes the initial formation of a first film of aluminum oxide on said upper surface of said silicon oxide substrate for separating said aluminum film from said substrate;

etching said aluminum layer for providing an aluminum pattern and continuing said etching step partially through said first layer of aluminum oxide for exposing a first surface; and forming by chemical vapor deposition a second layer of aluminum oxide on said pattern and on said first surface whereby, said first layer of aluminum oxide combines with said second layer of aluminum oxide ot completely enclose said aluminum pattern to prevent a reaction between said aluminum pattern and said silicon oxide substrate.

4. A method for forming a semiconductor device and for preventing a chemical reaction between an aluminum member and an adjacent silicon oxide substrate comprising:

providing a semiconductor member having at least a major surface and at least one identifiable region formed therein;

forming a silicon oxide layer over said major surface including said one identifiable region, said silicon oxide layer having an upper surface;

patterning said silicon oxide layer by forming an aperture through said silicon oxide layer for exposing a portion of said region only;

forming through vacuum evaporation an aluminum film on said upper surface of said silicon oxide substrate at a temperature below 300° C. and at a pressure greater than about $10^{-5}$ torr in the presence of water vapor which includes the initial formation of a first film of aluminum oxide on said upper surface of said silicon oxide substrate for separating said aluminum film from said substrate;

etching said aluminum layer and said first aluminum oxide layer to form a specific pattern of aluminum oxide and aluminum and for exposing a portion of said upper surface of said silicon oxide layer and exposing an edge portion of said first aluminum oxide layer; and forming by chemical vapor deposition a second layer of aluminum oxide on said patern and on said first surface whereby, said aluminum pattern contacts said identifiable region and remains insulated from said silicon oxide layer by said edge portion of said first layer of aluminum oxide combining with said second layer of aluminum oxide to completely insulate said aluminum pattern from said silicon oxide for preventing a reaction between said aluminum pattern and said silicon oxide layer.

5. A method for forming a semiconductor device and for preventing a chemical reaction between an aluminum member and an adjacent silicon oxide substrate, comprising:

providing a semiconductor member having at least a major surface and at least one identifiable region formed therein;

forming a silicon oxide layer over said major surface including said one identifiable region, said silicon oxide layer having an upper surface;

patterning said silicon oxide layer by forming an aperture through said silicon oxide layer for exposing a portion of said region only;

forming through vacuum evaporation an aluminum film on said upper surface of said silicon oxide substrate at a temperature below 300° C. and at a pressure greater than about $10^{-5}$ torr in the presence of water vapor; which includes the initial formation of a first film of aluminum oxide on said upper surface of said silicon oxide substrate for separating said aluminum film from said substrate;

etching said aluminum layer for providing an aluminum pattern and continuing said etching step partially through said first layer of aluminum for exposing a first surface of said first aluminum oxide layer; and forming by chemical vapor deposition a second layer of aluminum oxide on said pattern and on said exposed upper surface of said silicon oxide layer and said exposed edge portion of said first layer of aluminum oxide whereby, said aluminum pattern contacts said identifiable region and remains insulated from said silicon oxide layer by said edge portion of said first aluminum oxide layer combining with said second aluminum oxide layer to completely enclose said aluminum in said patern and to prevent a reaction between said aluminum layer and said silicon oxide layer.

References Cited

UNITED STATES PATENTS

| | | | |
|---|---|---|---|
| 3,634,203 | 1/1972 | McMahon et al. | 317—234 R |
| 3,431,636 | 3/1969 | Granberry et al. | 317—235 |
| 3,502,950 | 3/1970 | Nigh et al. | 317—235 |
| 3,436,327 | 4/1969 | Shockley | 117—212 |
| 3,697,334 | 10/1972 | Yamamoto et al. | 117—215 |
| 3,657,007 | 4/1972 | Pammer | 117—106 |
| 3,698,071 | 10/1972 | Hall | 117—212 |

DOUGLAS J. DRUMMOND, Primary Examiner

J. MASSIE, Assistant examiner

U.S. Cl X.R.

117—106 R, 107, 212, 217